(12) United States Patent
Danyuk et al.

(10) Patent No.: US 10,601,384 B2
(45) Date of Patent: Mar. 24, 2020

(54) SINGLE ENDED INSTRUMENTATION FOLDED CASCODE AMPLIFIER

(71) Applicant: Harman International Industries, Incorporated, Stamford, CT (US)

(72) Inventors: Dimitri Danyuk, Milford, CT (US); Todd A. Eichenbaum, Oxdford, CT (US)

(73) Assignee: Harman International Industries, Incorporated, Stamford, CT (US)

(*) Notice: Subject to any disclaimer, the term of this patent is extended or adjusted under 35 U.S.C. 154(b) by 0 days.

(21) Appl. No.: 16/098,734

(22) PCT Filed: May 3, 2017

(86) PCT No.: PCT/US2017/030809
§ 371 (c)(1),
(2) Date: Nov. 2, 2018

(87) PCT Pub. No.: WO2017/192700
PCT Pub. Date: Nov. 9, 2017

(65) Prior Publication Data
US 2019/0140608 A1 May 9, 2019

Related U.S. Application Data

(60) Provisional application No. 62/331,131, filed on May 3, 2016.

(51) Int. Cl.
*H03F 3/45* (2006.01)
*H03F 1/32* (2006.01)

(52) U.S. Cl.
CPC ....... *H03F 3/45798* (2013.01); *H03F 1/3211* (2013.01); *H03F 3/45291* (2013.01);
(Continued)

(58) Field of Classification Search
CPC ............. H03F 3/45798; H03F 3/45291; H03F 1/3211; H03F 3/45475; H03F 3/45304;
(Continued)

(56) References Cited

U.S. PATENT DOCUMENTS 6,150,885 A * 11/2000 Ashby ................. H03F 3/45304
330/257
7,202,738 B1 4/2007 Huijsing et al.
(Continued)

*Primary Examiner* — Khanh V Nguyen
(74) *Attorney, Agent, or Firm* — Brooks Kushman, P.C.

(57) ABSTRACT

An instrumentation amplifier configured for providing high common mode rejection and low distortion is described and includes an input differential pair configured to receive a differential input voltage and differential feedback voltage and a folded cascode amplifying stage configured to receive output current mode signals provided from the input differential pair. A current mirror is configured to mirror output current mode signals provided from said folded cascode amplifying stage. An external gain setting configuration may include a resistor feedback network, which includes a first resistor being connected between feedback inputs of said input differential pair, a second resistor between an output terminal of the current mirror and a first feedback input of said input differential pair, a third resistor between a common terminal and a second feedback input of said input differential pair.

19 Claims, 9 Drawing Sheets

(52) U.S. Cl.
CPC ..... *H03F 3/45304* (2013.01); *H03F 3/45475* (2013.01); *H03F 2200/129* (2013.01); *H03F 2200/261* (2013.01); *H03F 2200/453* (2013.01); *H03F 2203/45116* (2013.01); *H03F 2203/45138* (2013.01); *H03F 2203/45408* (2013.01); *H03F 2203/45412* (2013.01); *H03F 2203/45414* (2013.01); *H03F 2203/45431* (2013.01); *H03F 2203/45528* (2013.01)

(58) Field of Classification Search
CPC . H03F 2203/45528; H03F 2203/45414; H03F 2200/129; H03F 2203/45116; H03F 2203/45431; H03F 2203/45412; H03F 2203/45408; H03F 2203/45138; H03F 2200/453; H03F 2200/261; H03F 3/45183; H03F 3/45071; H03F 1/34; H03F 3/4518; H03G 1/0023; H03G 1/0088
USPC .................................. 330/69, 254, 258, 260
See application file for complete search history.

(56) References Cited

U.S. PATENT DOCUMENTS

| | | | |
|---|---|---|---|
| 7,495,511 B2* | 2/2009 | Gilbert | H03F 1/26 330/254 |
| 8,130,035 B2* | 3/2012 | Weigandt | H03F 1/26 330/254 |
| 10,084,421 B1* | 9/2018 | Danyuk | H03G 3/007 |
| 2007/0035342 A1 | 2/2007 | Chen et al. | |

* cited by examiner

SINGLE ENDED INSTRUMENTATION FOLDED CASCODE AMPLIFIER

CROSS-REFERENCE TO RELATED APPLICATION

This application is the U.S. national phase of PCT Application No. PCT/US2017/030809 filed on May 3, 2017, which claims the benefit of U.S. Provisional Patent Application No. 62/331,131 filed on May 3, 2016, the disclosures of which are incorporated in their entirety by reference herein.

TECHNICAL FIELD

The present disclosure generally relates to single-ended instrumentation folded cascode amplifier and method(s) for obtaining high common mode rejection.

BACKGROUND

FIG. 1 shows a prior art instrumentation amplifier that includes three op-amps. Instrumentation amplifier comprises two op amps, A1 and A2, which operate as "gain cells" and are suitably connected together so that a differential input signal is applied to the non-inverting inputs of the two op amps, while the outputs of the two op amps are applied as a differential input to a third op amp, A3, that is connected as a difference amplifier. Instrumentation amplifier shown in FIG. 1 required three gain blocks and precise matching of resistors R4 through R7.

One approach for an instrumentation amplifier which does not require three gain blocks is disclosed by Bowers in "An Ultra-Low-Noise Monolithic Microphone Preamplifier" presented at AES 83rd Convention, October 1987 (paper No 2495) and by Nelson in "Wideband Feedback Amplifier", U.S. Pat. No. 4,628,279. This topology is presented in FIG. 2. Input transistors Q1 and Q2 form a differential pair, loaded by R1 and R2. Emitters of the input devices are connected together with resistor Ra. Any imbalance in collector currents is sensed by amplifier A1 and corrected through feedback resistor R5 to the emitter of Q2. R3 provides dc balance to the system and is equal in value to R5. Both input devices have finite resistance signal path from their emitter to common terminal/output (R3 and R5). A common mode input signal changes the current through both input transistors Q1 and Q2. This change may cause unnecessary degradation of the common mode rejection ratio and additional distortion of the amplified signal.

Elevated input capacitance is another drawback of this circuit. Miller effect accounts for the increase in the input capacitance of the input devices due to amplification of the capacitance between the base and collector terminals. Junction capacitance depends of the applied voltage. Input capacitance variation with the input signal introduces additional distortion to the amplifier.

SUMMARY

An instrumentation amplifier is described herein for providing high common mode rejection and low distortion. The instrumentation amplifier can include an input differential stage configured to receive a differential input voltage and differential feedback voltage, a folded cascode amplifying stage configured to receive output current mode signals provided from said input differential stage, a current mirror configured to mirror output current mode signals provided from said folded cascode amplifying stage, and an external gain setting stage. The external gain setting stage may include a first resistor feedback network, which includes a first resistor being connected between feedback inputs of said input differential stage, a second resistor between an output terminal of the output stage and a first feedback input of said input differential stage, and a third resistor between a common terminal and a second feedback input of said input differential stage.

In an example embodiment, the input differential stage includes an input differential transistor pair. The transistors in the differential pair can be field effect devices and be the same type of device.

In an example embodiment, the amplifier includes a current-controlled current source with an input and an output.

In an example embodiment, the amplifier includes a current buffer transistor pair with each transistor in the current buffer transistor pair being configured as a current divider with a corresponding one of transistors of the folded cascode amplifying stage.

In an example embodiment, the current buffer transistor pair is configured to provide a portion of a sum of an output current from the input differential stage to the input of current-controlled current source.

In an example embodiment, the amplifier includes a current controlled current source configured to provide cancellation current to the feedback input of the input differential stage.

In an example embodiment, the amplifier includes the current-controlled current source includes outputs connected to the first feedback input and the second feedback input, respectively.

In an example embodiment, the external gain setting stage further comprises a fourth resistor connected between a first output of the current-controlled current source and the first feedback input of said input differential transistor stage, and a fifth resistor between a second output of the current-controlled current source and the second feedback input of said input differential transistor stage.

In an example embodiment, the current controlled current source is configured to provide cancellation voltage to the fourth resistor and the fifth resistor of said feedback configuration.

In an example embodiment, the output stage includes a current-controlled voltage source.

In an example embodiment, the amplifier includes an output buffer and an output resistor. The output buffer is configured to receive a differential current mode signal from the current mirror and provide an output voltage to the first resistor feedback network. The output resistor can be coupled to an input terminal of said output buffer.

In an example embodiment, a second resistor external gain setting stage is connected between an output terminal of the output buffer and a first feedback input of said input differential stage.

In an example embodiment, the output buffer configured to receive a differential current mode signal from the current mirror and includes an output terminal to provide an output voltage to the first resistor feedback network. The output resistor is coupled to an input terminal of said output buffer.

In an example embodiment, the external gain setting stage includes a second resistor feedback network connected between the input terminal of the output buffer and the first resistor feedback network.

In an example embodiment, the amplifier includes a current-controlled current source with an input and an output and a current buffer transistor pair with each transistor in the current buffer transistor pair being configured as a current divider with a corresponding one of transistors of the folded cascode amplifying stage. The current buffer transistor pair is configured to provide a portion of a sum of an output current from the input differential stage to the input of current-controlled current source. The current controlled current source is configured to provide cancellation current to the feedback input of said input differential stage.

In an example embodiment, the current-controlled current source includes outputs connected to the first feedback input and the second feedback input, respectively.

In an example embodiment, the external gain setting stage includes a fourth resistor connected between a first output of the current-controlled current source and the first feedback input of said input differential transistor stage, and a fifth resistor between a second output of the current-controlled current source and the second feedback input of said input differential transistor stage.

Various methods can be used with the example embodiments described herein. 13. In an example, embodiment, a method for obtaining high common mode rejection in an instrumentation amplifier can include the steps of receiving a differential input signal in a differential input pair of the instrumentation amplifier, splitting output current mode signals provided from said differential input pair by a pair of folded cascode transistors and additional pair of transistors, configured as current buffers, summing a portion of output current mode signals provided from said additional pair of transistors, receiving the sum of the portion of the output current mode signals provided from said additional pair of transistors at an input of a current controlled current source, and providing an output current of the current controlled current source to a feedback network and to feedback inputs of the differential input stage.

In an example embodiment, the method includes feeding an output from one of the pair of folded cascode transistors to an input of an output buffer to output a single ended output.

In an example embodiment, the method includes feeding the single ended output from the output buffer to the feedback network.

In an example embodiment, the method includes providing the common mode signal to be removed from the differential input signal at the differential input pair by supplying the current to mosfets of the differential input pair.

In an example embodiment, splitting output current mode signals includes inputting a first differential signal to a first transistor of the folded cascode transistors and a first transistor of the additional pair of transistors, inputting a second differential signal to a second transistor of the folded cascode transistors and a second transistor of the additional pair of transistors.

In an example embodiment, providing the output current includes providing a cancellation current to the feedback input of the differential input pair.

In an example embodiment, providing the cancellation current includes dividing the cancellation current between a first feedback terminal to the first transistor of the differential input pair and a second feedback terminal to the second transistor of the differential input pair.

In an example embodiment, providing the cancellation current includes sending the cancellation current through a first resistor to the first feedback terminal and through a second resistor to the second feedback terminal.

In an example embodiment, feeding a cancellation voltage feedback signal to a first feedback terminal to a first transistor of the differential pair.

The above amplifier circuitry and methods can be a stage in a commercial amplifier component to amplify an audio input signal, e.g., from a microphone or an input from a music player, to a level to drive a loudspeaker.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
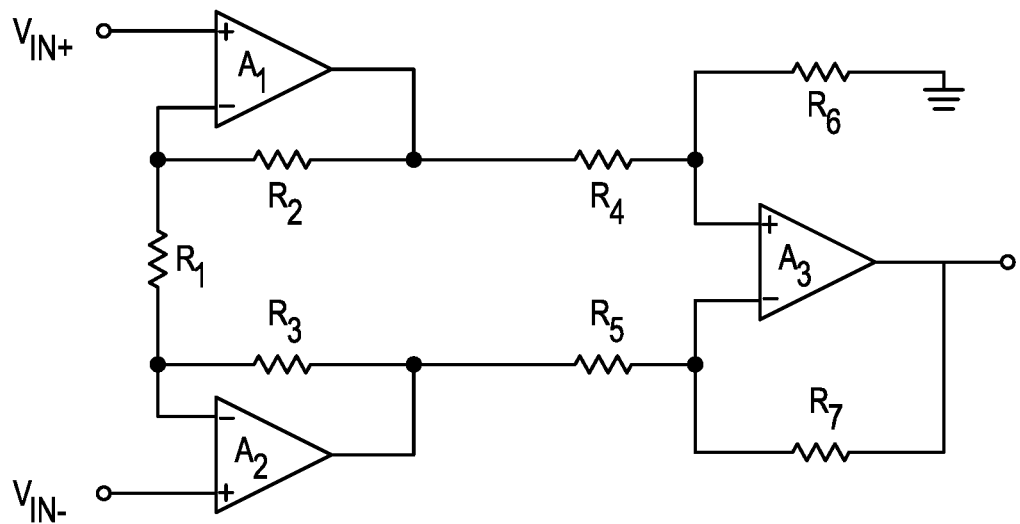
FIG. 1 illustrates a prior art circuit.
Figure 2:
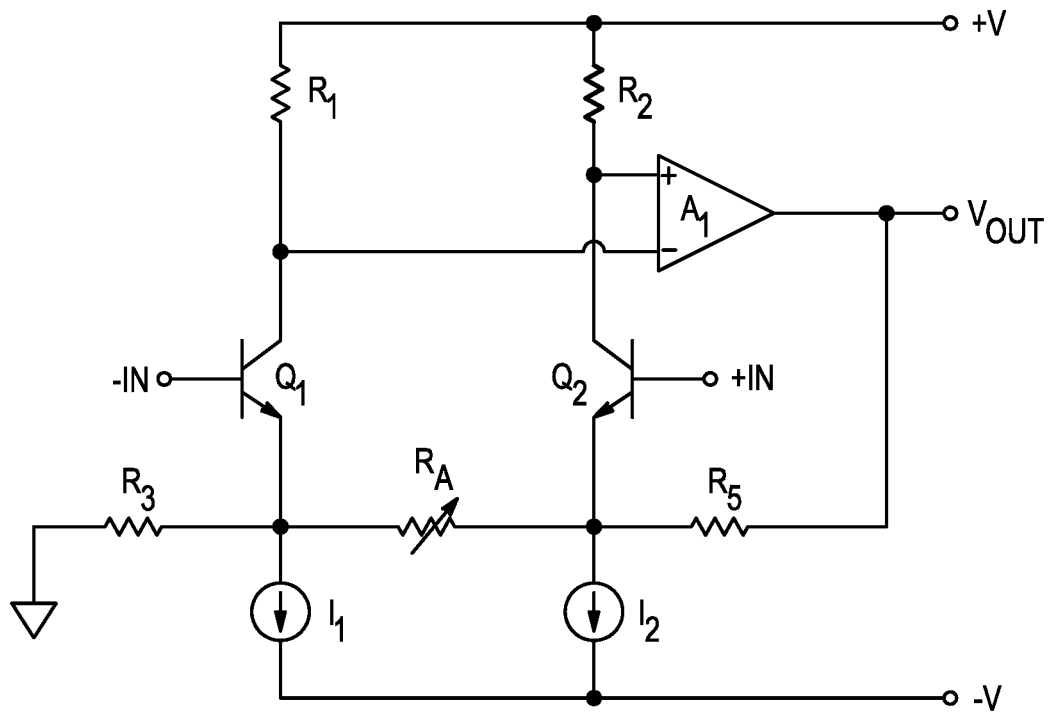
FIG. 2 illustrates a prior art circuit.
Figure 3:
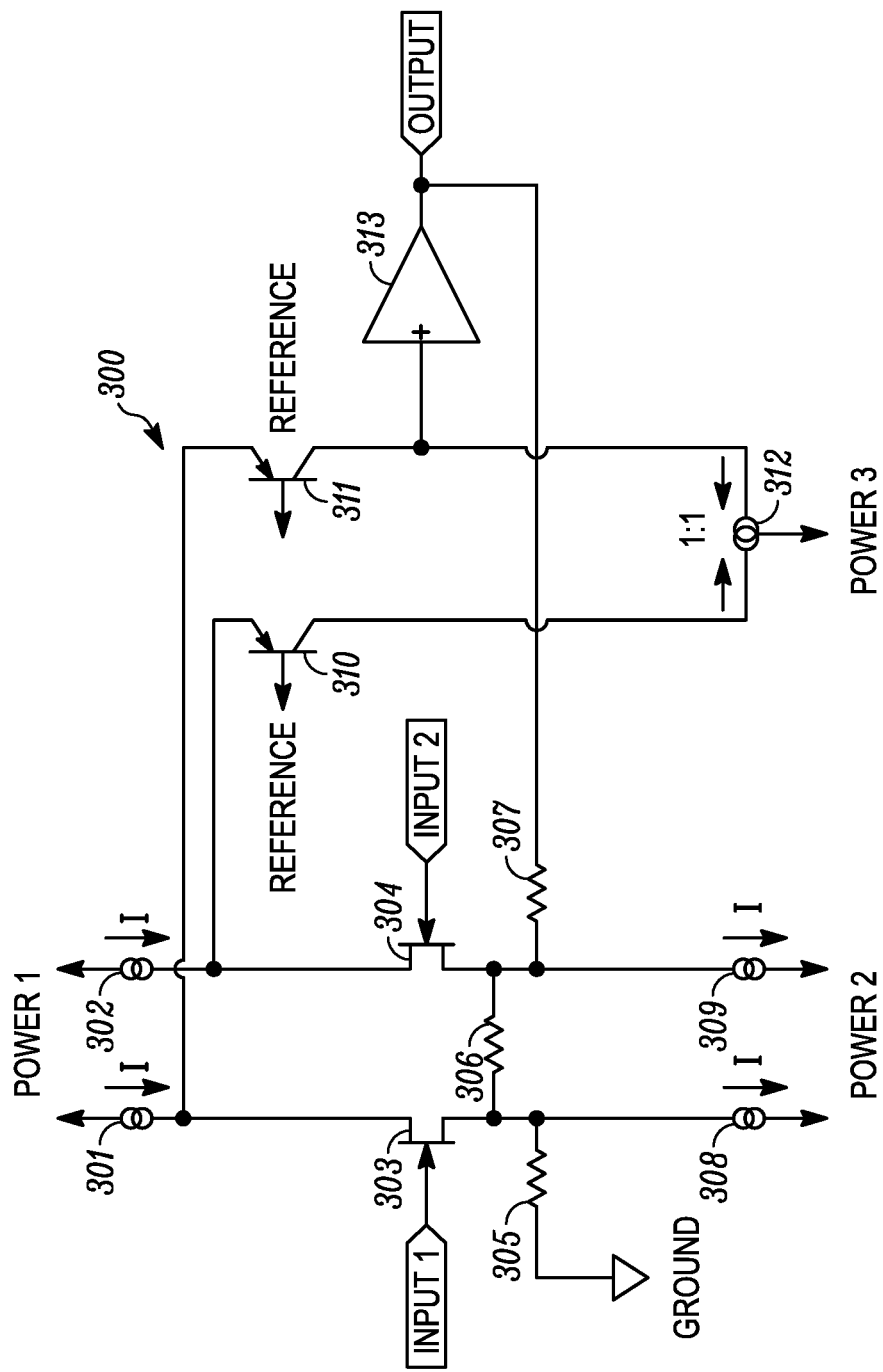
FIG. 3 illustrates a single-ended instrumentation folded cascode amplifier circuit, according to an embodiment.

FIG. 3 illustrates a single-ended, folded cascode instrumentation amplifier circuit 300 with a differential input stage including a first transistor 303 and a second transistor 304. The first and second transistors 303, 304 can form an input differential pair or transistors. A single ended output may be a feature of the circuit 300, e.g., output from the output stage 313. In an example, the transistors 303, 304 are field effect transistors, e.g., jfets. The transistors 303, 304 can be the same type of device. The drain of each transistor 303, 304 are connected to a constant current source(s) 301, 302. The constant current source 301 is connected to the drain of first transistor 303. The constant current source 302 is connected to the drain of second transistor 304. The gate of transistor 303 is connected to the first input. The gate of transistor 304 is connected to the second input. The source of each transistor 303, 304 are connected to a constant current source(s) 308, 309. In an example, the source of transistor 303 is connected to constant current source 308. In an example, the source of transistor 304 is connected to constant current source 309. The drain of the first transistor 303 is connected to the emitter of the fourth transistor 311. The drain of the second transistor 304 is connected to the emitter of the third transistor 310. The bases of the third transistor 310 and the fourth transistor 311 are connected to a reference terminal. The collectors of both the third transistor 310 and the fourth transistor 311 are connected to a current mirror 312. The transistors 310, 311 can operate as the level shifting stage or amplifying stage. The collector of the fourth transistor 311 is connected to the input of an output stage 313, e.g., of an amplifier or amplifier circuit. The output stage 313 may be a voltage controlled voltage source. The output from the output stage 313 is fed back to the source of transistor 304 through a resistor 307. The sources of the transistors 303, 304 are connected through resistor 306. The source of the first transistor 303 is connected to the common terminal, e.g., ground through a resistor 305.

In operation, the first transistor 303 and the second transistor 304 of the differential input stage has a cascode (common-base), level-shifting transistors 311, 310, with emitter being connected to the drain terminals, respectively. The present instrumentation amplifier circuit 300 obtains negative feedback by connecting the output from the amplifier (output stage) back to the sources of the first and second transistors through the resistor 307 and the resistors 307 and 306, respectively.

Using a folded cascode input stage addresses potential issues with input capacitance in the circuit 300. In some applications, the circuit 300 may exhibit a modulation of the input stage with common mode signal, which may introduce distortion and may not have an optimized reduced common mode rejection ratio.

Figure 4:
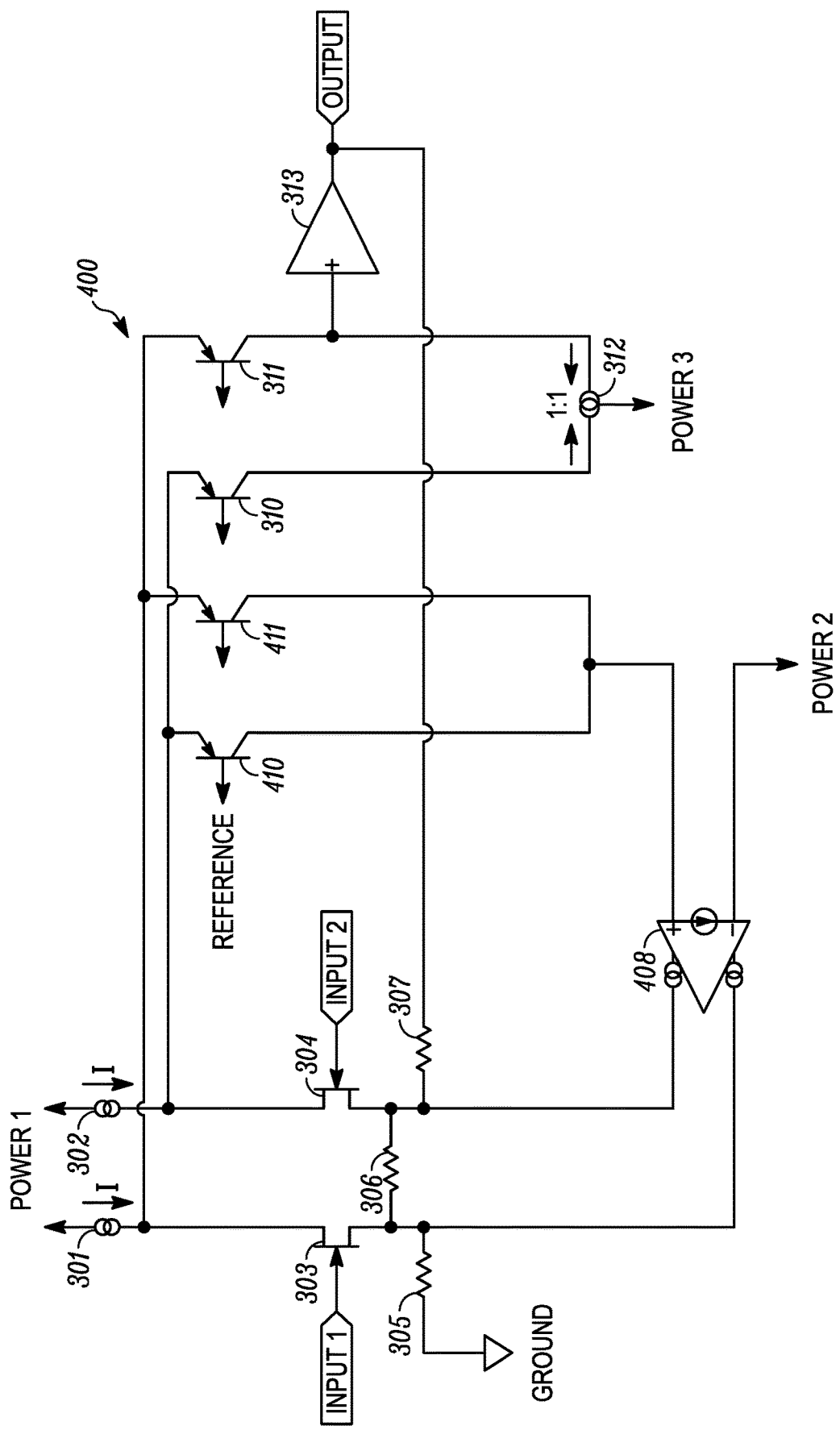
FIG. 4 illustrates a single-ended instrumentation folded cascode amplifier circuit, according to an embodiment.

FIG. 4 illustrates a single-ended, folded cascode instrumentation amplifier circuit 400 with elements common with the circuit 300 being designated with the same reference numbers. Circuit 400 includes an additional current controlled current source 408 to suitably compensate variation of the differential input stage currents with input signal. The drain of the first transistor 303 is connected to the emitter of the fifth transistor 411. The drain of the second transistor 304 is connected to the emitter of the sixth transistor 410. The bases of the fifth transistor 411 and the sixth transistor 410 are connected to the reference terminal. In an example, the collectors of the fifth transistor 411 and the sixth transistor 410 are connected to an input of a current controlled current source 408. The other input of the current source 408 is connected to the reference terminal. The sources of the transistors 303, 304 are connected to the outputs of the current source 408. The sources are biased by the resistor network. e.g., resistors 305, 306, 307.

The common mode signal on the gates of transistors 303, 304 of the input differential stage alters current of both input devices. This current alteration is reflected in the total current of additional cascode devices 310, 311 or 410, 411. In an example, the current controlled current source 408 senses total output current of the additional devices 410, 411. Current controlled current source 408 has two equivalent current outputs, which are in phase. Output terminals of current controlled current source 408 couple with the sources of the input stage transistors 303, 304 and feedback network, e.g., resistor network 305, 306, 307. Current controlled current source 408 compares the total current through the additional devices 410, 411 with a reference signal. The current difference is amplified and then fed back to the input stage, e.g., devices 303, 304, with proper phase to maintain a current flow through the input devices substantially independent of the common mode input signal.

Figure 5:
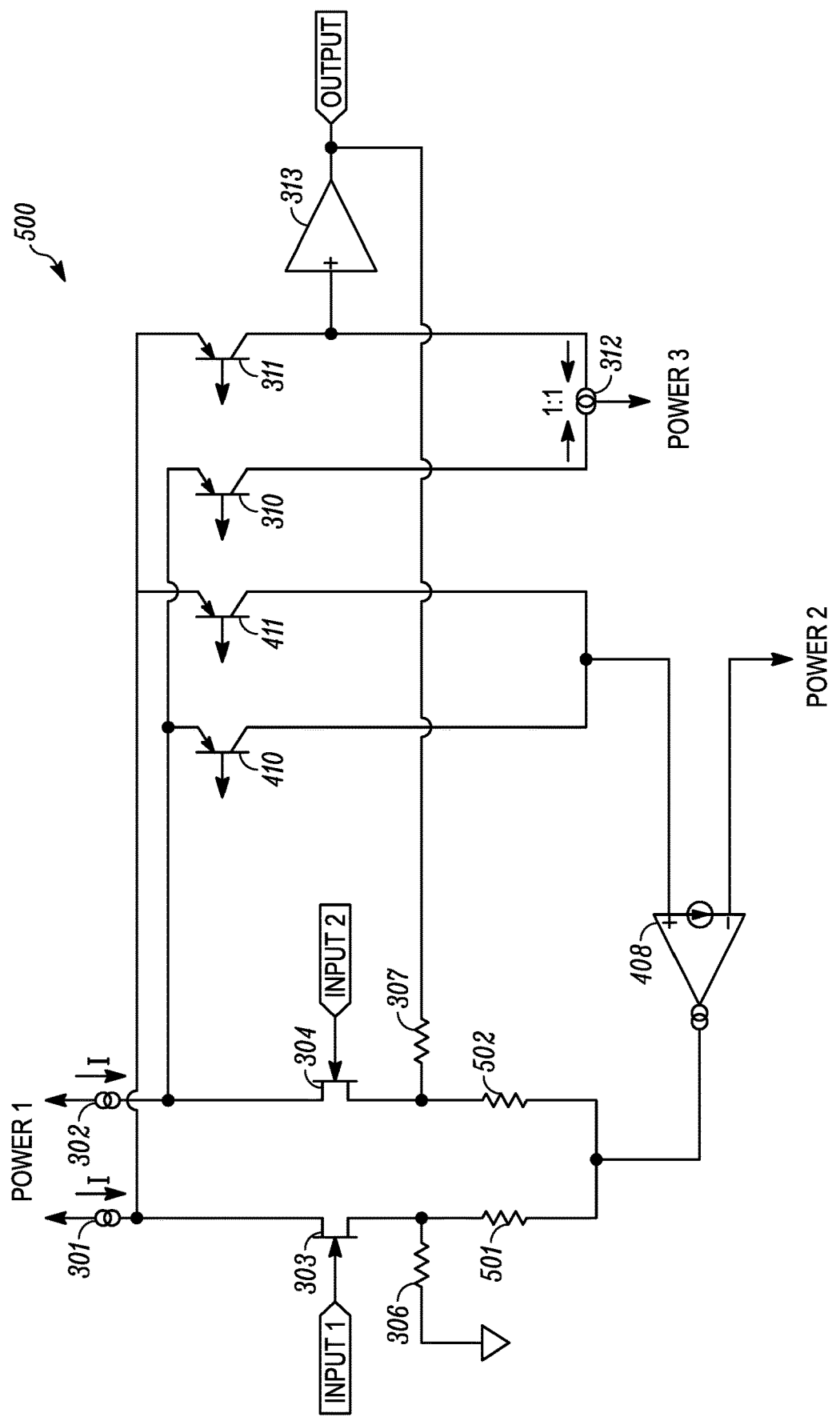
FIG. 5 illustrates a single-ended instrumentation folded cascode amplifier circuit, according to an embodiment.

FIG. 5 illustrates a single-ended, folded cascode instrumentation amplifier circuit 500 with elements common with the circuit 400 being designated with the same reference numbers. The resistor 306 is divided into two resistors 501, 501. The resistor 501 connects between the output of the current source 408 and the source of the transistor 303. The resistor 502 connects between the output of the current source 408 and the source of the transistor 304. The resistors 501, 502 can have equal values. The resistors 501, 502 operate to maintain equal current flow though the input stage, e.g., transistors 303, 304.

Figure 6:
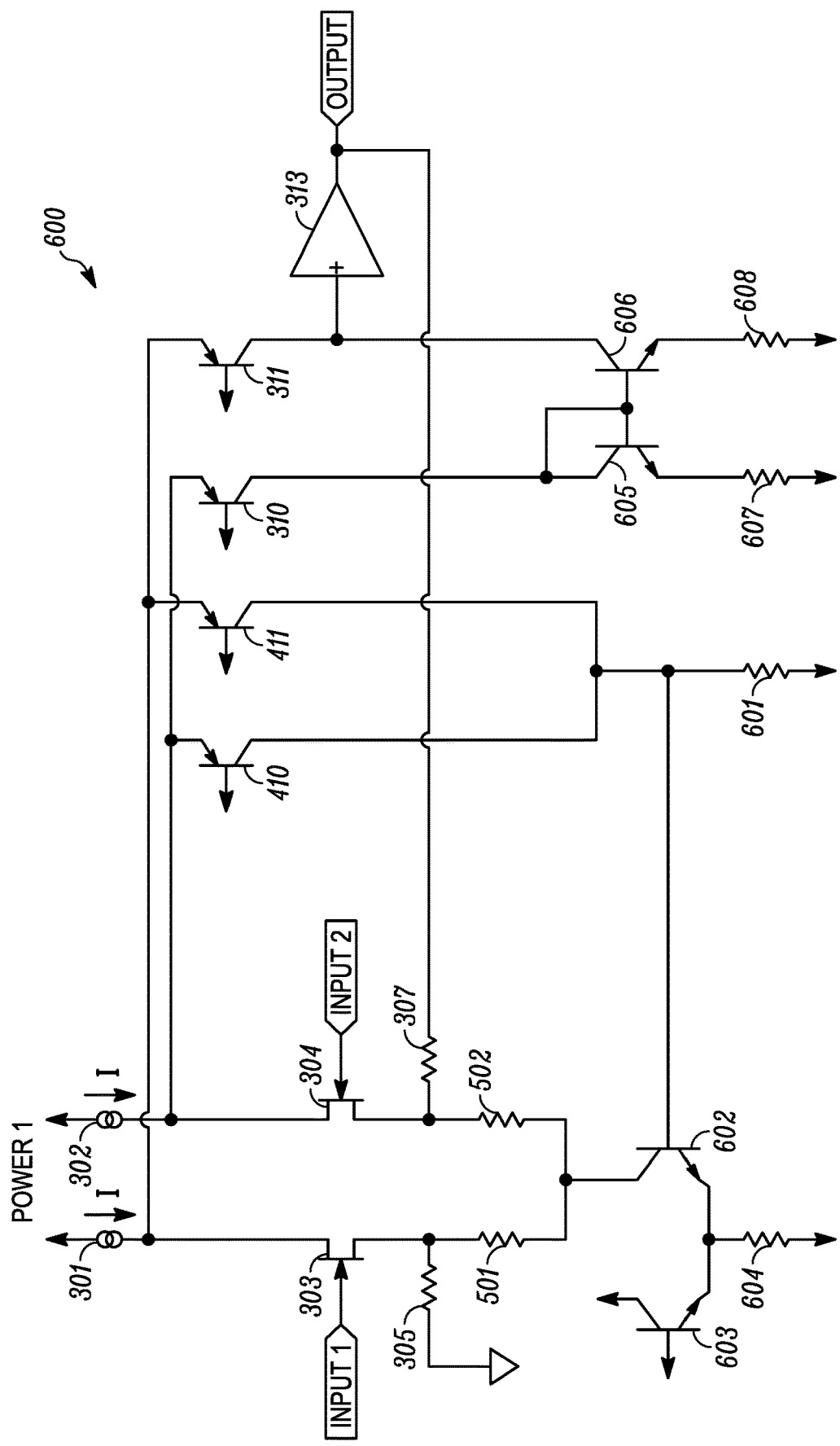
FIG. 6 illustrates a single-ended instrumentation folded cascode amplifier circuit, according to an embodiment.

FIG. 6 illustrates a single-ended, folded cascode instrumentation amplifier circuit 600 with elements common with the circuit 500 being designated with the same reference numbers. In circuit 600, a differential pair of transistors 602, 603 and resistor 601 operates as the current controlled current source. A resistor 601 biases the summed output from transistors 410, 411 to the power terminal. The summed output from the transistors 410, 411 is connected to the base of transistor 602. The collector of transistor 602 connects to the resistors 501, 502, which are in turn connected at their other terminal to the sources of the transistors 303, 304 of the input stage. The transistor 603 has its base connected to the reference terminal and collector connected to power terminal. The emitters of transistors 602, 603 are both connected to the reference terminal through a resistor 604.

Total current of the additional current followers (transistors 410, 411 and related circuitry) produces a voltage drop on the series resistor 601. This voltage drop is compared with a reference voltage and the difference is converted in the output current of the differential stage at the collector of transistor 602.

A current-controlled voltage source is connected to the amplifying or level stage with a pair of transistors 605, 606 connected to the transistors 310, 311, respectively. Both of the bases of the transistors 605, 606 are connected to the collector of the transistor 310. The collector of the transistor 605 is connected to the collector of transistor 310. The emitter of the transistor 605 is connected through resistor 607 to a common terminal. The collector of the transistor 606 is connected to the collector of transistor 311. The emitter of the transistor 606 is connected through resistor 608 to a common terminal. The transistors 605, 606 can be configured as a type of Wilson current mirror.

Figure 7:
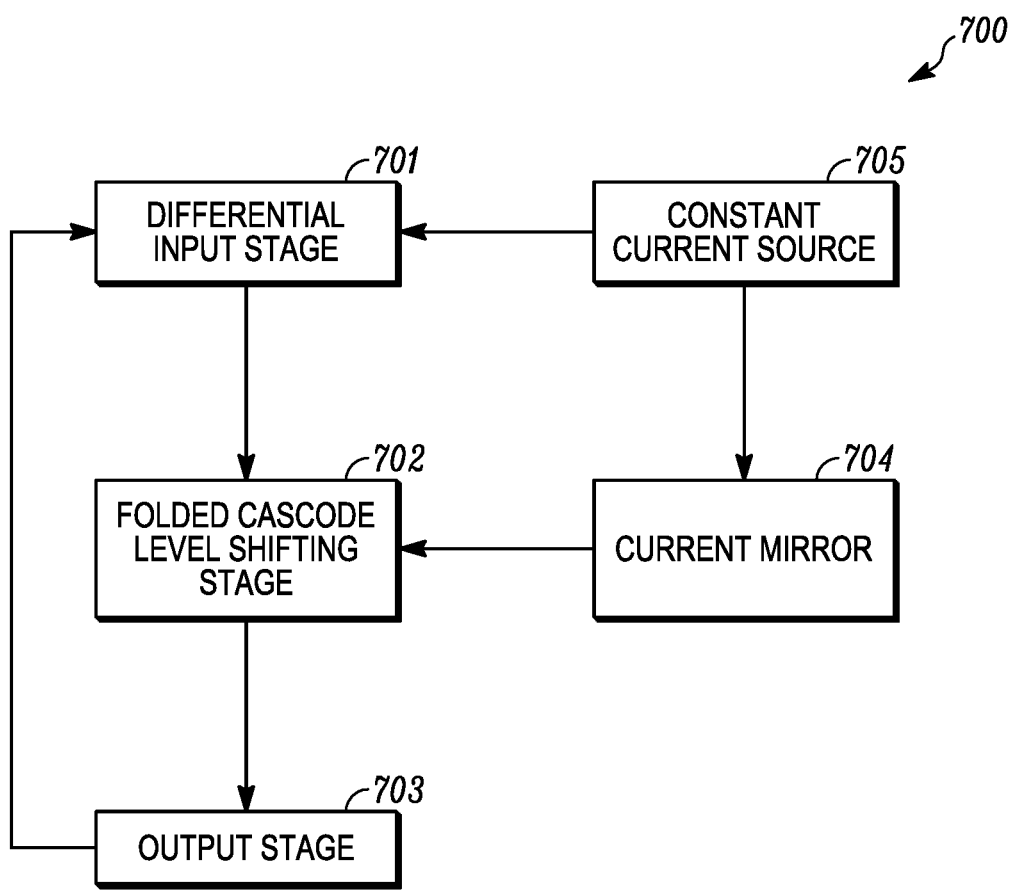
FIG. 7 illustrates a schematic view of illustrates a single-ended instrumentation folded cascode amplifier, according to an embodiment.

FIG. 7 illustrates a schematic view of the single-ended, folded cascode instrumentation amplifier 700. The differential input stage 701 receives a differential input signal. A common mode signal may introduce an undesirable signal as part of the input to the differential input stage. The differential input stage outputs a differential signal to the level-shifting stage 702. The level-shifting stage 702 can be a differential folded cascode amplifying stage with an output stage 703. A current mirror 704 is connected to the output of the level-shifting stage. The output stage 703 is fed back to the differential input stage. The differential input stage 701 may include a resistor feedback network (e.g., resistors 305-307, 501, 502) that receives the feedback signal from the output stage 703 or from the folded cascode configuration. In an example, the constant current source 705 may also be connected to the differential input stage through the feedback network.

Figure 8:
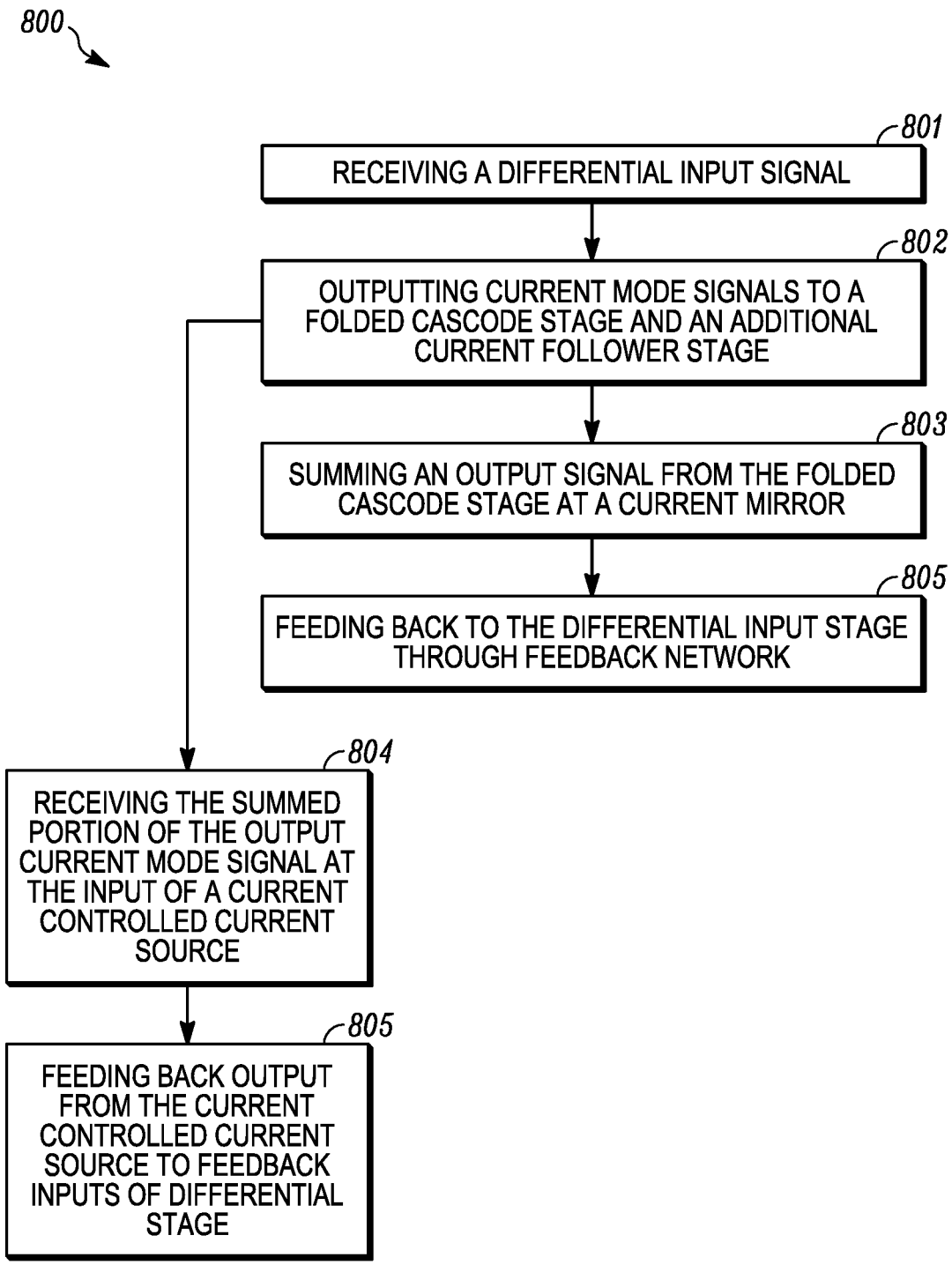
FIG. 8 illustrates a method for obtaining high common mode rejection.

FIG. 8 illustrates an operation method 800. The method 800 includes receiving a differential input signal in a differential input pair of the instrumentation amplifier (801). Output current mode signals provided from the differential pair are split by means of a pair of folded cascode transistors and additional pair of transistors, configured as current buffers (802). A portion of output current mode signals provided from said additional pair of transistors is summed (803). The sum of the portion of the output current mode signals provided from the additional pair of transistors is received at the input of current controlled current source (804). An output current of the current controlled current source is received at the feedback network and to the feedback inputs of the differential input stage (805).

Figure 9:
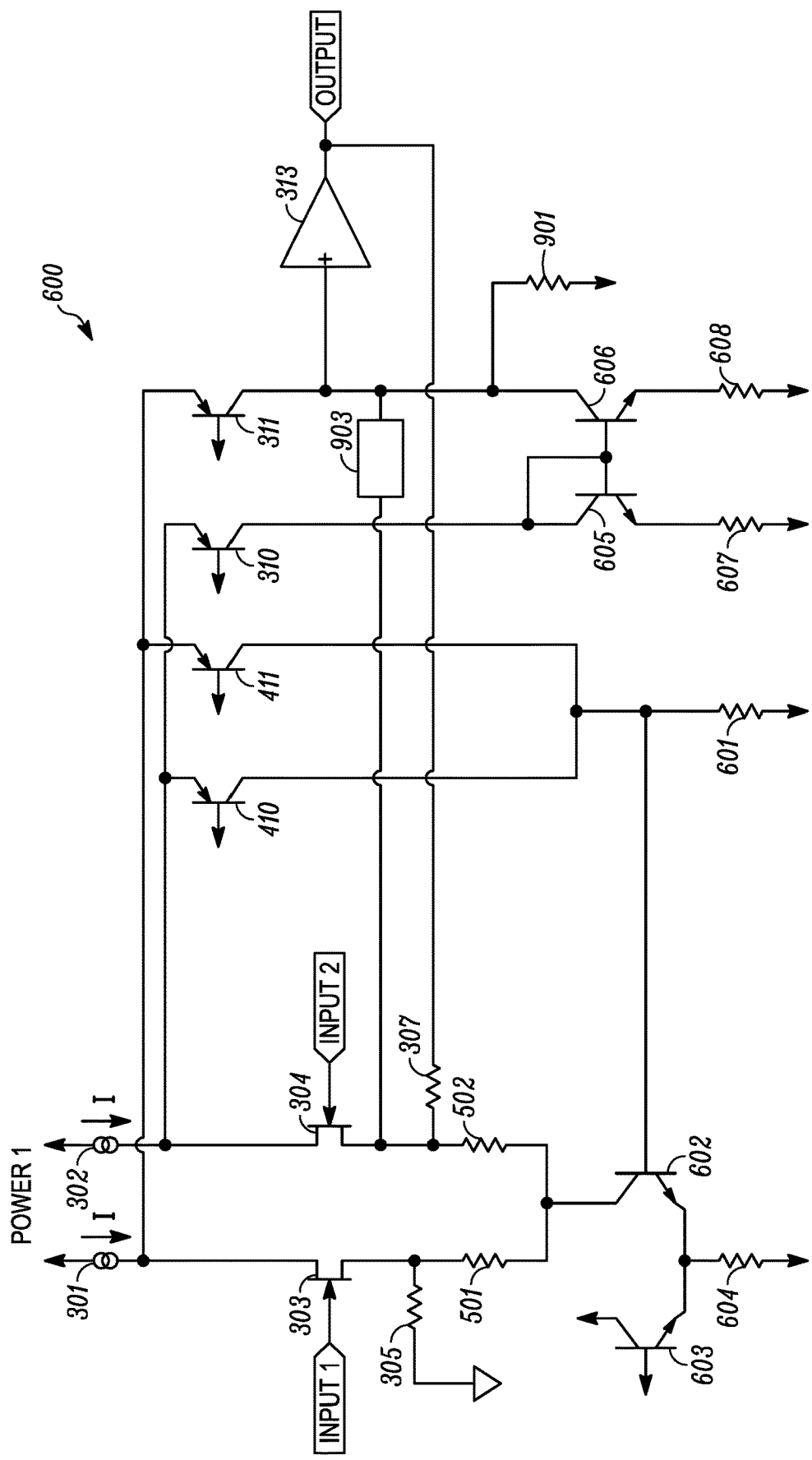
FIG. 9 illustrates a schematic view of illustrates a single-ended instrumentation folded cascode amplifier, according to an embodiment.

FIG. 9 shows a single-ended, folded cascode instrumentation amplifier circuit 600A with elements common with the circuit 600 being designated with the same reference numbers. Circuit 600A includes an output resistor 901 connected between the single input to the output buffer 313 and the common terminal (e.g., a ground plane). The output buffer 313 can include a single input operational amplifier. The output buffer 313 outputs the single ended output signal. The output signal is input into the first resistance network that is connected to the input differential stage. The output from the second resistance network 903 provides the feedback signal to the first resistance network, e.g., to resistor 307. The first and second resistance networks can operate to control the gain setting. The first and second resistance networks can be the external gain setting circuitry. The first and second networks can be connected in parallel. The input of the output buffer receives a differential current mode signal output from the current mirror through the resistor 903.

Figure 10:
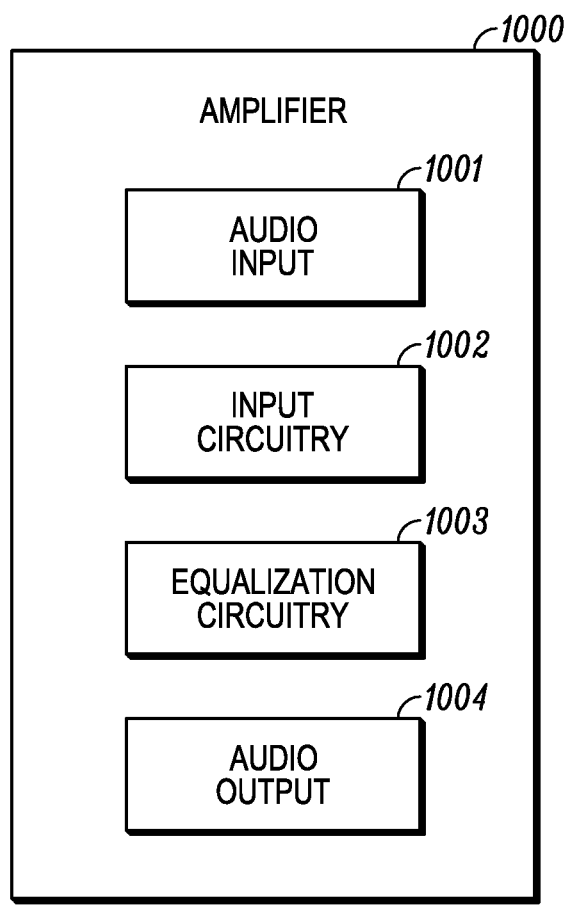
FIG. 10 illustrates a schematic view of an audio amplifier with the single-ended instrumentation folded cascode amplifier, according to an example embodiment.

FIG. 10 shows an electronic amplifier 1000 that uses the amplifier circuits 300, 400, 500, 600, 600A or 700 to process audio signals. The electronic amplifier 100 may be a component for a home audio system or a musical instrument amplifiers, like guitar amplifiers The amplifier 1000 may include an audio input 1001 to receive an electrical signal that encodes audio signals. The audio signal can be an analog signal. The audio input circuitry 1001 can receive a low power level audio signal, e.g., from a microphone, an electric guitar pickup, or germane musical instruments, or from a radio receiver, digital musical player, turntable or the like. Amplifier circuitry 1002 receives the signal from the input circuitry 1001. The amplifier circuitry 1002 can be any one of the amplifier circuits 300, 400, 500, 600, 600A or 700, in various examples. The amplifier circuitry 1002 can receive a low-power, inaudible electronic audio signals and strengthen the signal, e.g., raise the power in the signal or the voltage level. Optionally, an equalization stage 1003 receives the amplified audio signal from the amplifier circuitry 1002 and can condition the audio signal, which is then output to output amplifier circuitry 1004. The output amplifier 1004 can provide a final gain to the audio signal to drive the signal to loudspeakers (not shown).

An amplifier 300, 400, 500, 600, 600A or 700 includes a single ended output that feeds back to the sources in the differential input stage (e.g., 303, 304), which can be differential input transistors, connected to a cascode level shifting stage (e.g., 310, 311). A current mirror 312 biases the cascode level shifting stage. The feedback stage includes feedback network, e.g., 305, 306, 307 including a plurality of resistive elements. A first resistor 307 connects the output from the output stage to a source of a first input transistor. A second resistor 306 connected the sources of both the first input transistor and a second input transistor. A third resistor 305 connects the source of the second transistor to a common terminal, e.g., ground or a set voltage level. The feedback from the output controls the input stage.

Various embodiments are described. In an example embodiment, an instrumentation amplifier is configured for providing high common mode rejection and low distortion. The instrumentation amplifier may include an input differential pair configured to receive a differential input voltage and differential feedback voltage, a folded cascode amplifying stage configured to receive output current mode signals provided from said input differential pair, a current mirror configured to mirror output current mode signals provided from said folded cascode amplifying stage, and an external gain setting configuration comprising a resistor feedback network, which includes a first resistor being connected between feedback inputs of said input differential pair, a second resistor between an output terminal of the current mirror and a first feedback input of said input differential pair, a third resistor between a common terminal and a second feedback input of said input differential pair.

The above embodiment may also include an output buffer and an output resistor. The output buffer is configured to receive a differential current mode signal from the current mirror and provide an output voltage to the feedback network. The output resistor is coupled to an input terminal of said output buffer.

In any of the above embodiments, the second resistor external gain setting configuration is connected between the output terminal of the output buffer and the first feedback input of said input differential pair.

In any of the above embodiments, the instrumentation amplifier further comprises an additional pair of transistors connected as current buffers. Each of the transistors is configured as a current divider with a correspondent one of the transistors of the folded cascode amplifying stage. The additional pair of transistors is configured to provide a portion of the sum of the output current of the input differential stage to an input of a current controlled current source.

In any of the above embodiments, the current controlled current source is configured to provide cancellation current to the feedback input of said input differential stage.

In any of the above embodiments, an additional pair of transistors connected as current buffers, each of said additional pair of transistor is configured as a current divider with a corresponding one of the transistors of the folded cascode amplifying stage.

In any of the above embodiments, the additional pair of transistors is configured to provide a portion of a sum of the output current of the input differential stage to the input of current controlled current source.

In any of the above embodiments, the current controlled current source is configured to provide cancellation current to the feedback input of said input differential stage.

In any of the above embodiments, an external gain setting configuration comprises a pair of resistors being connected between feedback inputs of said input differential pair. The third resistor is connected between an output of current mirror and first feedback input of the input differential pair. A fourth resistor is connected between the common terminal and second feedback input of said input differential pair. A fifth resistor is connected between the common terminal of a pair of resistors being connected between feedback inputs of the input differential pair and an output of current controlled current source.

In any of the above embodiments, the external gain setting configuration comprises the resistor network, first resistor being connected between feedback inputs of the input differential pair, second resistor between the output terminal of the current mirror and first feedback input of the input differential pair, third resistor between the common terminal and second feedback input of said input differential pair, fourth resistor between the output terminal of voltage controlled current source and first feedback input of said input differential pair, fifth resistor between an output terminal of voltage controlled current source and second feedback input of said input differential pair. The current controlled voltage source is configured to provide cancellation voltage to the fourth resistor and the fifth resistor of said feedback configuration.

In any of the above embodiments, the external gain setting configuration comprises resistor network, first resistor being connected between feedback inputs of said input differential pair, second resistor between the output terminal of the output buffer and first feedback input of said input differential pair, third resistor between the common terminal and second feedback input of said input differential pair, fourth resistor between the output terminal of voltage controlled current source and first feedback input of said input differential pair, fifth resistor between output terminal of voltage controlled current source and second feedback input of said input differential pair. The current controlled voltage source is configured to provide cancellation voltage to the fourth and fifth resistor of said feedback configuration.

In any of the above embodiments, the external gain setting configuration comprises resistor network, a pair of resistors being connected between feedback inputs of said input differential pair, a third resistor between the output of current mirror and first feedback input of said input differential pair, a fourth resistor between the common terminal and second feedback input of said input differential pair, a fifth resistor between the common terminal of a pair of resistors being connected between feedback inputs of said input differential pair and an output of current controlled voltage source. In any of the above embodiments, the current controlled voltage source is configured to provide cancellation voltage to the fifth resistor of said feedback configuration.

In any of the above embodiments, the external gain setting configuration comprises a resistor network. The resistor network can include a pair of resistors being connected between feedback inputs of said input differential pair, a third resistor between an output of the output buffer and the first feedback input of said input differential pair, a fourth resistor between the common terminal and second feedback input of said input differential pair, a fifth resistor between the common terminal of a pair of resistors being connected between feedback inputs of said input differential pair and the output of current controlled voltage source. The current controlled voltage source is configured to provide cancellation voltage to the fifth resistor of said feedback configuration.

Any of the above embodiments can provide the following method or the method can operate outside the specific examples described above. The method for obtaining high common mode rejection in an instrumentation amplifier can include the steps of receiving a differential input signal in a differential input pair of the instrumentation amplifier; splitting output current mode signals provided from said differential input pair by means of a pair of folded cascode transistors and additional pair of transistors, configured as current buffers; summing a portion of output current mode signals provided from said additional pair of transistors; receiving the sum of the portion of the output current mode signals provided from said additional pair of transistors at an input of a current controlled current source; and providing an output current of the current controlled current source to a feedback network and to feedback inputs of the differential input stage.

The present circuitry described herein may have a differential folded cascode amplifying stage in single ended instrumentation amplifier. The present circuitry may operate to provide an enhanced common mode rejection ratio of a single gain block instrumentation amplifier. The present circuitry may have a differential folded cascode amplifying stage which permits high precision and low distortion of amplified signals without degrading common mode rejection ratio. The above and other advantages of the present disclosure are carried out in one form by a differential folded cascode amplifier circuit which may include additional current controlled current source.

The above described amplifier circuits, systems and methods can be component circuitry in an audio amplifier.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

We claim:

1. An instrumentation amplifier configured for providing high common mode rejection and low distortion, said instrumentation amplifier comprising:
    an input differential stage configured to receive a differential input voltage and differential feedback voltage, the input differential stage including an input differential transistor pair;
    a folded cascode amplifying stage configured to receive output current mode signals provided from said input differential stage;
    a current mirror configured to mirror output current mode signals provided from said folded cascode amplifying stage; and
    an external gain setting stage including a first resistor feedback network, which includes a first resistor being connected between feedback inputs of said input differential stage, a second resistor between an output terminal of an output stage and a first feedback input of said input differential stage, and a third resistor between a common terminal and a second feedback input of said input differential stage;
    a current-controlled current source with an input and an output;
    a current buffer transistor pair with each transistor in the current buffer transistor pair being configured as a current divider with a corresponding one of transistors of the folded cascode amplifying stage;
    wherein said current buffer transistor pair is configured to provide a portion of a sum of an output current from the input differential stage to the input of the current-controlled current source; and
    wherein said current-controlled current source is configured to provide cancellation current to the feedback input of said input differential stage.

2. The instrumentation amplifier according to claim 1, wherein said current-controlled current source includes outputs connected to the first feedback input and the second feedback input, respectively.

3. The instrumentation amplifier according to claim 1, wherein the external gain setting stage further comprises:
    a fourth resistor connected between a first output of the current-controlled current source and the first feedback input of said input differential stage, and
    a fifth resistor between a second output of the current-controlled current source and the second feedback input of said input differential stage.

4. The instrumentation amplifier according to claim 3, wherein said current-controlled current source is configured to provide cancellation voltage to the fourth resistor and the fifth resistor of said external gain setting stage.

5. The instrumentation amplifier according to claim 4, wherein the output stage includes a current-controlled voltage source.

6. The instrumentation amplifier according to claim 5, further comprises:
   an output buffer and an output resistor, said output buffer configured to receive a differential current mode signal from the current mirror and provide an output voltage to the first resistor feedback network, said output resistor being coupled to an input terminal of said output buffer; and
   wherein a second resistor external gain setting stage is connected between an output terminal of the output buffer and a first feedback input of said input differential stage.

7. The instrumentation amplifier according to claim 1, further comprises:
   an output buffer and an output resistor, said output buffer configured to receive a differential current mode signal from the current mirror, said output buffer includes an output terminal to provide an output voltage to the first resistor feedback network, said output resistor being coupled to an input terminal of said output buffer; and
   wherein the external gain setting stage includes a second resistor feedback network connected between the input terminal of the output buffer and the first resistor feedback network.

8. The instrumentation amplifier according to claim 7, further comprising:
   a current-controlled current source with an input and an output;
   a current buffer transistor pair with each transistor in the current buffer transistor pair being configured as a current divider with a corresponding one of transistors of the folded cascode amplifying stage;
   wherein said current buffer transistor pair is configured to provide a portion of a sum of an output current from the input differential stage to the input of the current-controlled current source; and
   wherein said current controlled current source is configured to provide a cancellation current to the first feedback input of said input differential stage.

9. The instrumentation amplifier according to claim 8, wherein said current-controlled current source includes outputs connected to the first feedback input and the second feedback input, respectively.

10. The instrumentation amplifier according to claim 9, wherein the external gain setting stage further comprises:
    a fourth resistor connected between a first output of the current-controlled current source and the first feedback input of said input differential stage, and
    a fifth resistor between a second output of the current-controlled current source and the second feedback input of said input differential stage.

11. A method for obtaining high common mode rejection in an instrumentation amplifier, said method comprising the steps of:
    receiving a differential input signal in a differential input pair of the instrumentation amplifier;
    splitting output current mode signals provided from said differential input pair by a pair of folded cascode transistors and additional pair of transistors, configured as current buffers;
    summing a portion of output current mode signals provided from said additional pair of transistors;
    receiving the sum of the portion of the output current mode signals provided from said additional pair of transistors at an input of a current controlled current source; and
    providing an output current of the current controlled current source to a feedback network and to feedback inputs of the differential input stage.

12. The method of claim 11, further comprising feeding an output from one of the pair of folded cascode transistors to an input of an output buffer to output a single ended output.

13. The method of claim 12, further comprising feeding the single ended output from the output buffer to the feedback network.

14. The method of claim 13, further comprising providing a common mode signal to be removed from the differential input signal at the differential input pair by supplying a current signal to mosfets of the differential input pair.

15. The method of claim 11, wherein splitting output current mode signals includes inputting a first differential signal to a first transistor of the folded cascode transistors and a first transistor of the additional pair of transistors, inputting a second differential signal to a second transistor of the folded cascode transistors and a second transistor of the additional pair of transistors.

16. The method of claim 15, wherein providing the output current includes providing a cancellation current to the feedback input of the differential input pair.

17. The method of claim 16, wherein providing the cancellation current includes dividing the cancellation current between a first feedback terminal to the first transistor of the differential input pair and a second feedback terminal to the second transistor of the differential input pair.

18. The method of claim 11, further comprising feeding a cancellation voltage feedback signal to a first feedback terminal to a first transistor of the differential input pair.

19. An instrumentation amplifier configured for providing high common mode rejection and low distortion, said instrumentation amplifier comprising:
    an input differential stage configured to receive a differential input voltage and differential feedback voltage;
    a folded cascode amplifying stage configured to receive output current mode signals provided from said input differential stage;
    a current mirror configured to mirror output current mode signals provided from said folded cascode amplifying stage;
    an external gain setting stage including a first resistor feedback network, which includes a first resistor being connected between feedback inputs of said input differential stage, a second resistor between an output terminal of an output stage and a first feedback input of said input differential stage, and a third resistor between a common terminal and a second feedback input of said input differential stage;
    an output buffer and an output resistor, said output buffer configured to receive a differential current mode signal from the current mirror, said output buffer includes an output terminal to provide an output voltage to the first resistor feedback network, said output resistor being coupled to an input terminal of said output buffer; and
    wherein the external gain setting stage includes a second resistor feedback network connected between the input terminal of the output buffer and the first resistor feedback network.

* * * * *